(12) United States Patent
Kwon et al.

(10) Patent No.: US 9,465,289 B2
(45) Date of Patent: Oct. 11, 2016

(54) PHOTOSENSITIVE RESIN COMPOSITION FOR DISPLAY DEVICE INSULATION FILM, AND DISPLAY DEVICE INSULATION FILM AND DISPLAY DEVICE USING SAME

(71) Applicant: Cheil Industries Inc., Gumi-si (KR)

(72) Inventors: Ji-Yun Kwon, Suwon-si (KR); Jin-Hee Kang, Suwon-si (KR); Yong-Tae Kim, Suwon-si (KR); Jong-Hwa Lee, Suwon-si (KR); Jin-Young Lee, Suwon-si (KR); Dae-Yun Kim, Suwon-si (KR); Sang-Kyun Kim, Suwon-si (KR); In-Chul Hwang, Suwon-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 14/416,204

(22) PCT Filed: Apr. 9, 2013

(86) PCT No.: PCT/KR2013/002970
§ 371 (c)(1),
(2) Date: Jan. 21, 2015

(87) PCT Pub. No.: WO2014/104486
PCT Pub. Date: Jul. 3, 2014

(65) Prior Publication Data
US 2015/0185605 A1    Jul. 2, 2015

(30) Foreign Application Priority Data
Dec. 28, 2012 (KR) .................. 10-2012-0157571

(51) Int. Cl.
| | | |
|---|---|---|
| C08F 2/46 | (2006.01) | |
| C08F 2/50 | (2006.01) | |
| C08G 61/04 | (2006.01) | |
| G03F 7/022 | (2006.01) | |
| G03F 7/023 | (2006.01) | |
| G03F 7/105 | (2006.01) | |

(52) U.S. Cl.
CPC .......... *G03F 7/0226* (2013.01); *G03F 7/0233* (2013.01); *G03F 7/105* (2013.01)

(58) Field of Classification Search
USPC ............... 522/47, 6, 1, 71, 189, 184; 520/1
See application file for complete search history.

(56) References Cited

U.S. PATENT DOCUMENTS

| | | |
|---|---|---|
| 6,929,890 B2 | 8/2005 | Miyoshi et al. |
| 7,361,445 B2 | 4/2008 | Banba et al. |
| 7,851,123 B2 | 12/2010 | Suzuki |
| 8,158,972 B2 | 4/2012 | Thompson et al. |
| 8,361,682 B2 | 1/2013 | Kim et al. |
| 2004/0197703 A1* | 10/2004 | Miyoshi et al. ........... 430/270.1 |
| 2012/0171610 A1 | 7/2012 | Lee et al. |

FOREIGN PATENT DOCUMENTS

| | | |
|---|---|---|
| JP | S63-096162 A | 4/1988 |
| JP | 09-302221 A | 11/1997 |
| JP | 10-307393 A | 11/1998 |
| JP | 2000-292913 A | 10/2000 |
| JP | 2003-330175 A | 11/2003 |
| JP | 2008-145579 A | 6/2008 |
| JP | 2009-117266 A | 5/2009 |
| JP | 4303560 B2 | 7/2009 |
| JP | 2012-032820 A | 2/2012 |
| KR | 10-2004-0087918 A | 10/2004 |
| KR | 10-0842168 A | 6/2008 |
| KR | 10-2010-0053796 A | 5/2010 |
| KR | 10-2010-0080343 A | 7/2010 |
| KR | 10-1072953 A | 10/2011 |
| KR | 10-2011-0135185 A | 12/2011 |
| KR | 10-2012-0033894 A | 4/2012 |
| KR | 10-2012-0078324 A | 7/2012 |
| WO | 2009/049273 A2 | 4/2009 |
| WO | 20140104486 A1 | 7/2014 |

OTHER PUBLICATIONS

International Search Report in counterpart International Application No. PCT/KR2013/002970 dated Sep. 5, 2013, pp. 1-8.

* cited by examiner

Primary Examiner — Ling Choi
Assistant Examiner — Jessica E Whiteley
(74) Attorney, Agent, or Firm — Additon, Higgins & Pendleton, P.A.

(57) ABSTRACT

The present invention discloses a photosensitive resin composition for an insulating film of a display device including (A) an alkali soluble resin; (B) a photosensitive diazoquinone compound; (C) a color material having a maximum absorption wavelength of 400 to 550 nm; and (D) a solvent, an insulation film using the same, and a display device including the insulation film.

6 Claims, No Drawings

PHOTOSENSITIVE RESIN COMPOSITION FOR DISPLAY DEVICE INSULATION FILM, AND DISPLAY DEVICE INSULATION FILM AND DISPLAY DEVICE USING SAME

CROSS-REFERENCE TO RELATED APPLICATIONS

This application claims priority to and the benefit of International Application No. PCT/KR2013/002970, filed Apr. 9, 2013, which published as WO 2014/104486 on Jul. 3, 2014, and Korean Patent Application No. 10-2012-0157571, filed in the Korean Intellectual Property Office on Dec. 28, 2012, the entire disclosure of each of which is incorporated herein by reference.

TECHNICAL FIELD

This disclosure relates to a photosensitive resin composition for an insulating film of a display device, an insulating film of a display device using the same, and a display device.

BACKGROUND ART

Conventionally, a surface protective layer and an interlayer insulating film for a semiconductor device use a polyimide resin having excellent heat resistance, electrical characteristics, mechanical characteristics, and the like. The polyimide resin has recently been used as a photosensitive polyimide precursor composition. The photosensitive polyimide precursor composition is easily coated on a semiconductor device, patterned by ultraviolet (UV) rays, developed, and heat-imidized, and thereby, forms a surface protective layer, an interlayer insulating film, and the like.

Accordingly, the photosensitive polyimide precursor composition may remarkably shorten a processing time compared with a conventional non-photosensitive polyimide precursor composition.

The photosensitive polyimide precursor composition can be applied as a positive type in which an exposed part is developed and dissolved and a negative type in which the exposed part is cured and maintained. The positive type photosensitive polyimide precursor composition is preferably used, since a non-toxic alkali aqueous solution is used as a development solution. The positive photosensitive polyimide precursor composition includes a polyimide precursor of polyamic acid, a photosensitive material of diazonaphtoquinone, and the like.

However, the positive photosensitive polyimide precursor composition has a problem of obtaining no desired pattern, because the carboxylic acid of the polyamic acid is too highly soluble in an alkali.

In order to solve this problem, a material including a polybenzoxazole precursor and a diazonaphtoquinone compound has drawn attention (Japanese Patent Laid-open Publication No. S63-96162). However, when actually used as the polybenzoxazole precursor composition, film loss of an unexposed part is remarkably increased, hardly obtaining a desirable pattern after the development.

In order to improve this problem, if the molecular weight of the polybenzoxazole precursor is increased, the film loss of the unexposed part is reduced, but a residue (a scum) is generated during the development, deteriorating a resolution and increasing a development time on the exposed part.

In order to solve the problem, addition of a certain phenol compound to a polybenzoxazole precursor composition has been reported to suppress the film loss in unexposed parts during development (Japanese Patent Laid-Open Publication No. H9-302221 and Japanese Patent Laid-Open Publication No. 2000-292913). However, the suppression of the film loss in unexposed parts is insufficient. Accordingly, research on increasing the suppression of the film loss as well as preventing generation of the development residue (scum) is required. In addition, research on a dissolution-inhibiting agent is required, since a phenol compound used to adjust solubility is decomposed at a high temperature during curing, causes a side reaction, or the like and resultantly, does large damage on mechanical properties of a cured film.

On the other hand, the positive photosensitive resin composition including a polybenzoxazole precursor may be applied to an organic insulating film or a barrier rib material in a display device field. Many attempts have been recently made to develop a display device having high contrast ratio and high luminance. One of the attempts is to form a black filter layer between color patterns but has a problem of hardly realizing a high aperture ratio and bringing about low heat resistance and insulating properties. Thereafter, another attempt of securing a high aperture ratio by making a non-light emitting region black and simultaneously, improving a contrast ratio and visibility but has a problem of deteriorating inherent properties of an insulation layer because a colorant is dissolved in a large amount.

Of a colorant, an inorganic pigment as carbon black and the like used for a black mill-base, in general has excellent light shielding properties but has a problem of deteriorating insulating resistance properties, which is not appropriately applied to an insulation layer for an organic light emitting diode. An organic pigment relatively consists of a pigment mixture realizing a black color and thus, has better insulating resistance properties than the inorganic pigment but needs to be more included than the inorganic pigment in a photosensitive resin composition to accomplish equivalent light shielding properties and more possibly, deteriorates pattern developability and produces a residue.

DISCLOSURE

Technical Problem

On embodiment of the present invention provides a photosensitive resin composition for an insulating film of a display device having an improved film residue ratio, sensitivity, and dielectric constant, a low residue occurrence rate of an exposed part, and high luminance and improved characteristics.

Another embodiment of the present invention provides an insulating film of a display device using the photosensitive resin composition for an insulating film of a display device.

Yet another embodiment of the present invention provides a display device including the insulating film of a display device.

Technical Solution

According to one embodiment of the present invention, provided is a photosensitive resin composition for an insulating film of a display device that includes (A) an alkali soluble resin; (B) a photosensitive diazoquinone compound; (C) a color material having a maximum absorption wavelength of 400 to 550 nm; and (D) a solvent.

The alkali soluble resin (A) may be a polybenzoxazole precursor, polyamic acid, polyimide, or a combination thereof.

The color material (C) may include a triarylmethane-based compound, an azaporphyrin-based compound, or a combination thereof.

The photosensitive resin composition for an insulating film of a display device may include 5 to 100 parts by weight of the photosensitive diazoquinone compound (B); 1 to 30 parts by weight of the color material (C); and 100 to 900 parts by weight of solvent (D), based on 100 parts by weight of the alkali soluble resin (A).

The photosensitive resin composition for an insulating film of a display device may further include a silane compound.

The photosensitive resin composition for an insulating film of a display device may further include a phenol compound.

In another embodiment of the present invention, an insulating film of a display device manufactured using the photosensitive resin composition for an insulating film of a display device is provided.

In yet another embodiment of the present invention, a display device including the insulating film is provided.

Advantageous Effects

The photosensitive resin composition for an insulating film of a display device according to one embodiment of the present invention may realize high sensitivity, high resolution, and excellent pattern performance and developability, prevent light leakage among neighboring pixels, and increase color purity and thus, is appropriately applied to an insulation film of a display device such as a liquid crystal display, a light emitting diode, and the like.

BEST MODE

Exemplary embodiments will hereinafter be described in the detailed description. However, these embodiments are exemplary, and this disclosure is not limited thereto.

In the present specification, when specific definition is not otherwise provided, the term "substituted" refers to one substituted with at least a substituent selected from a halogen (—F, —Cl, —Br, or —I), a hydroxy group, a nitro group, a cyano group, an amino group, (NH$_2$, NH(R$^{200}$) or N(R$^{201}$)(R$^{202}$), wherein R$^{200}$, R$^{201}$ and R$^{202}$ are the same or different, and are independently a C1 to C10 alkyl group), an amidino group, a hydrazine group, a hydrazine group, a carboxyl group, a substituted or unsubstituted alkyl group, a substituted or unsubstituted alkenyl group, a substituted or unsubstituted alkynyl group, a substituted or unsubstituted alicyclic organic group, a substituted or unsubstituted aryl group, and a substituted or unsubstituted heterocyclic group, instead of at least one hydrogen of a functional group.

In the present specification, when specific definition is not otherwise provided, the term "alkyl group" refers to a C1 to C30 alkyl group, and specifically a C1 to C15 alkyl group, the term "cycloalkyl group" refers to a C3 to C30 cycloalkyl group, and specifically a C3 to C18 cycloalkyl group, the term "alkoxy group" refers to C1 to C30 alkoxy group, and specifically a C1 to C18 alkoxy group, the term "aryl group" refers to a C6 to C30 aryl group, and specifically a C6 to C18 aryl group, the term "alkenyl group" refers to a C2 to C30 alkenyl group, and specifically a C2 to C18 alkenyl group, the term "alkylene group" refers to a C1 to C30 alkylene group, and specifically a C1 to C18 alkylene group, and the term "arylene group" refers to a C6 to C30 arylene group, and specifically a C6 to C16 arylene group.

In the present specification, when specific definition is not otherwise provided, the term "aliphatic organic group" refers to a C1 to C30 alkyl group, a C2 to C30 alkenyl group, a C2 to C30 alkynyl group, a C1 to C30 alkylene group, a C2 to C30 alkenylene group, or a C2 to C30 alkynylene group, and specifically a C1 to C15 alkyl group, a C2 to C15 alkenyl group, a C2 to C15 alkynyl group, a C1 to C15 alkylene group, a C2 to C15 alkenylene group, or a C2 to C15 alkynylene group, the term "alicyclic organic group" refers to a C3 to C30 cycloalkyl group, a C3 to C30 cycloalkenyl group, a C3 to C30 cycloalkynyl group, a C3 to C30 cycloalkylene group, a C3 to C30 cycloalkenylene group, or a C3 to C30 cycloalkynylene group, and specifically a C3 to C15 cycloalkyl group, a C3 to C15 cycloalkenyl group, a C3 to C15 cycloalkynyl group, a C3 to C15 cycloalkylene group, a C3 to C15 cycloalkenylene group, or a C3 to C15 cycloalkynylene group, the term "aromatic organic group" refers to a C6 to C30 aryl group or a C6 to C30 arylene group, and specifically a C6 to C16 aryl group or a C6 to C16 arylene group, the term "heterocyclic group" refers to a C2 to C30 heterocycloalkyl group, a C2 to C30 heterocycloalkylene group, a C2 to C30 heterocycloalkenyl group, a C2 to C30 heterocycloalkenylene group, a C2 to C30 heterocycloalkynyl group, a C2 to C30 heterocycloalkynylene group, a C2 to C30 heteroaryl group, or a C2 to C30 heteroarylene group that include 1 to 3 hetero atoms selected from O, S, N, P, Si, and a combination thereof in a ring, and specifically a C2 to C15 heterocycloalkyl group, a C2 to C15 heterocycloalkylene group, a C2 to C15 heterocycloalkenyl group, a C2 to C15 heterocycloalkenylene group, a C2 to C15 heterocycloalkynyl group, a C2 to C15 heterocycloalkynylene group, a C2 to C15 heteroaryl group, or a C2 to C15 heteroarylene group that include 1 to 3 hetero atoms selected from O, S, N, P, Si, and a combination thereof in a ring.

One embodiment of the present invention provides a photosensitive resin composition for an insulating film of a display device that includes (A) an alkali soluble resin; (B) a photosensitive diazoquinone compound; (C) a color material having a maximum absorption wavelength of 400 to 550 nm; and (D) a solvent.

The photosensitive resin composition for an insulating film of a display device is a positive photosensitive resin composition.

Hereinafter, each component of the photosensitive resin composition for an insulating film of a display device is described.

(A) Alkali Soluble Resin

The alkali soluble resin (A) may be any generally-used alkali soluble resin in the art of the present invention without limitation. Specifically, the alkali soluble resin may be at least one selected from a polybenzoxazole precursor including a repeating unit represented by the following Chemical Formula 1, polyamic acid including a repeating unit represented by the following Chemical Formula 2 and polyimide including a repeating unit represented by the following Chemical Formula 3.

Polybenzooxazole Precursor

[Chemical Formula 1]

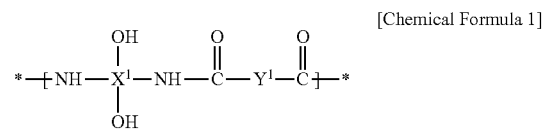

In the above Chemical Formula 1, $X^1$ is a substituted or unsubstituted C6 to C30 aromatic organic group, and $Y^1$ is a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

In the above Chemical Formula 1, $X^1$ may be an aromatic organic group which is a residual group derived from aromatic diamine.

The aromatic diamine may include at least one selected from 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2-bis(3-amino-4-hydroxy-5-trifluoromethylphenyl)hexafluoropropane, 2,2-bis(3-amino-4-hydroxy-6-trifluoromethylphenyl)hexafluoropropane, 2,2-bis(3-amino-4-hydroxy-2-trifluoromethylphenyl)hexafluoropropane, 2,2-bis(4-amino-3-hydroxy-5-trifluoromethylphenyl)hexafluoropropane, 2,2-bis(4-amino-3-hydroxy-6-trifluoromethylphenyl)hexafluoropropane, 2,2-bis(4-amino-3-hydroxy-2-trifluoromethylphenyl)hexafluoropropane, 2,2-bis(3-amino-4-hydroxy-5-pentafluoroethylphenyl)hexafluoropropane, 2-(3-amino-4-hydroxy-5-trifluoromethylphenyl-2-(3-amino-4-hydroxy-5-pentafluoroethylphenyl)hexafluoropropane, 2-(3-amino-4-hydroxy-5-trifluoromethylphenyl)-2-(3-hydroxy-4-amino-5-trifluoromethylphenyl)hexafluoropropane, 2-(3-amino-4-hydroxy-5-trifluoromethylphenyl)-2-(3-hydroxy-4-amino-6-trifluoromethylphenyl)hexafluoropropane, 2-(3-amino-4-hydroxy-5-trifluoromethylphenyl)-2-(3-hydroxy-4-ami no-2-trifluoromethylphenyl)hexafluoropropane, 2-(3-amino-4-hydroxy-2-trifluoromethylphenyl)-2-(3-hydroxy-4-ami no-5-trifluoromethylphenyl)hexafluoropropane, and 2-(3-amino-4-hydroxy-6-trifluoromethylphenyl)-2-(3-hydroxy-4-amino-5-trifluoromethylphenyl)hexafluoropropane, but is not limited thereto.

In the above Chemical Formula 1, $Y^1$ may be an aromatic organic group, divalent to hexavalent aliphatic organic groups, or divalent to hexavalent alicyclic organic groups, and may be a residual group of dicarboxylic acid or a residual group of a dicarboxylic acid derivative. Specifically, $Y^1$ may be an aromatic organic group, or divalent to hexavalent alicyclic organic groups.

Examples of the dicarboxylic acid include may be $Y^1(COOH)_2$ (wherein $Y^1$ is the same as $Y^1$ of the above Chemical Formula 1).

Examples of the carboxylic acid derivative include a carbonyl halide derivative of the dicarboxylic acid derivative, or an active compound of an active ester derivative obtained by reacting $Y^1(COOH)_2$ with 1-hydroxy-1,2,3-benzotriazole (wherein $Y^1$ is the same as $Y^1$ of the above Chemical Formula 1).

Examples of the dicarboxylic acid derivative includes 4,4'-oxydibenzoyl chloride, diphenyloxydicarbonyl dichloride, bis(phenylcarbonylchloride)sulfone, bis(phenylcarbonylchloride)ether, bis(phenylcarbonylchloride)phenone, phthaloyl dichloride, terephthaloyl dichloride, isophthaloyl dichloride, dicarbonyldichloride, diphenyloxydicarboxylate dibenzotriazole, or a combination thereof, but are not limited thereto.

The polybenzoxazole precursor may have a thermally polymerizable functional group derived from a reactive end-capping monomer, at one terminal end or both terminal ends of the branched chain. The reactive end-capping monomer may be monoamines, monoanhydrides, or a combination thereof having a carbon-carbon double bond. The monoamines may be toluidine, dimethylaniline, ethylaniline, aminophenol, aminobenzylalcohol, aminoindan, aminoacetonephenone, or a combination thereof, but are not limited thereto.

Polyamic Acid and Polyimide

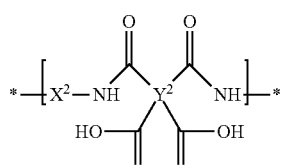

[Chemical Formula 2]

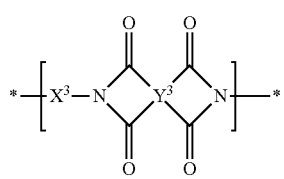

[Chemical Formula 3]

In the above Chemical Formulae 2 and 3, $X^2$ and $X^3$ are independently a substituted or unsubstituted C6 to C30 aromatic organic group, substituted or unsubstituted divalent to hexavalent C1 to C30 aliphatic organic groups, substituted or unsubstituted divalent to hexavalent C3 to C30 alicyclic organic groups, or an organic silane group.

Specifically, in the above Chemical Formulae 2 and 3, $X^2$ and $X^3$ are independently a residual group derived from aromatic diamine, alicyclic diamine, or silicon diamine. Herein, the aromatic diamine, alicyclic diamine, and silicon diamine may be used singularly or as a mixture of one or more.

The aromatic diamine may include 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis[4-(4-aminophenoxy)phenyl]sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, the forgoing compounds including an aromatic ring substituted with an alkyl group or a halogen, or a combination thereof, but is not limited thereto.

The alicyclic diamine may include 1,2-cyclohexyl diamine, 1,3-cyclohexyl diamine, or a combination thereof, but is not limited thereto.

The silicon diamine may include bis(4-aminophenyl)dimethylsilane, bis (4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, bis(γ-aminopropyl)tetraphenyldisiloxane, 1,3-bis(aminopropyl)tetramethyldisiloxane, or a combination thereof, but is not limited thereto.

In the above Chemical Formulae 2 and 3, $Y^2$ and $Y^3$ are independently a substituted or unsubstituted C6 to C30 aromatic organic group, substituted or unsubstituted tetravalent to hexavalent C1 to C30 aliphatic organic groups, or substituted or unsubstituted tetravalent to hexavalent C3 to C30 alicyclic organic groups.

The $Y^2$ and $Y^3$ may be independently residual groups derived aromatic acid dianhydride, or alicyclic acid dianhydride. The aromatic acid dianhydride and the alicyclic acid dianhydride may be used singularly or as a mixture of more than one.

The aromatic acid dianhydride may include benzophenone tetracarboxylic dianhydride such as pyromellitic dianhydride; benzophenone-3,3',4,4'-tetracarboxylic dianhydride, and the like; oxydiphthalic dianhydride such as 4,4'-oxydiphthalic dianhydride; biphthalic dianhydride such as 3,3',4,4'-biphthalic dianhydride; (hexafluoroisopropyledene) diphthalic dianhydride such as 4,4'-(hexafluoroisopropyledene)diphthalic dianhydride; naphthalene-1,4,5,8-tetracarboxylic dianhydride; 3,4,9,10-perylenetetracarboxylic dianhydride, and the like, but is not limited thereto.

The alicyclic acid dianhydride may include 1,2,3,4-cyclobutanetetracarboxylic dianhydride, 1,2,3,4-cyclopentanetetracarboxylic dian hydride, 5-(2,5-dioxotetrahydrofuryl)-3-methyl-cyclohexane-1,2-dicarboxylic anhydride, 4-(2,5-dioxotetrahydrofuran-3-yl)-tetralin-1,2-dicarboxylic anhydride, bicyclooctene-2,3,5,6-tetracarboxylic dianhydride, bicyclooctene-1,2,4,5-tetracarboxylic dianhydride, and the like, but is not limited thereto.

The alkali soluble resin may have a weight average molecular weight (Mw) of 5,000 to 20,000 g/mol, and specifically 6,000 to 10,000 g/mol. Within the above weight average molecular weight (Mw) of the alkali soluble resin, sufficient film residue ratios at non-exposed parts during development using an alkali aqueous solution, and patterning may be performed efficiently.

(B) Photosensitive Diazoquinone Compound

The photosensitive diazoquinone compound may be a compound having a 1,2-benzoquinone diazide structure or 1,2-naphtoquinone diazide structure.

The photosensitive diazoquinone compound may include at least one selected from the compounds represented by the following Chemical Formulae 4, and 6 to 8, but is not limited thereto.

[Chemical Formula 4]

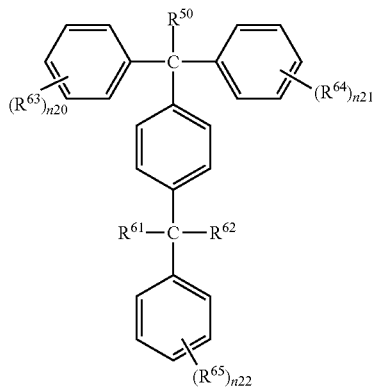

In the above Chemical Formula 4, $R^{60}$ to $R^{62}$ are independently a hydrogen atom, or a substituted or unsubstituted C1 to C30 alkyl group, specifically a methyl group.

In the above Chemical Formula 4, $R^{63}$ to $R^{65}$ are independently OQ, wherein Q is hydrogen, a functional group represented by the following Chemical Formula 5a or a functional group represented by the following Chemical Formula 5b, provided that Qs are not simultaneously hydrogen In the above Chemical Formula 4, $n^{20}$ to $n^{22}$ may be independently integers of 0 to 5.

[Chemical Formula 5a]

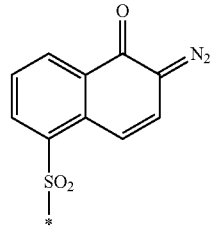

[Chemical Formula 5b]

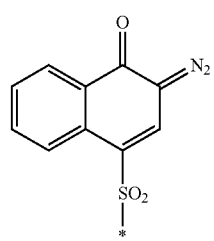

[Chemical Formula 6]

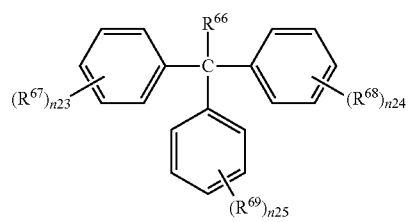

In the above Chemical Formula 6, $R^{66}$ is hydrogen, or a substituted or unsubstituted C1 to C30 alkyl group, $R^{67}$ to $R^{69}$ are independently OQ, wherein Q is the same as defined in the above, and $n^{23}$ to $n^{25}$ are integers of 0 to 5.

[Chemical Formula 7]

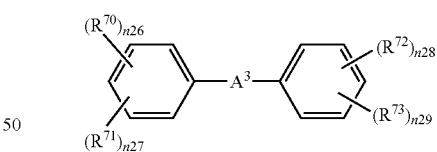

In the above Chemical Formula 7, $A^3$ is CO or $CR^{74}R^{75}$, wherein each $R^{74}$ and $R^{75}$ is independently a substituted or unsubstituted C1 to C30 alkyl group.

In the above Chemical Formula 7, $R^{70}$ to $R^{73}$ are independently hydrogen, a substituted or unsubstituted C1 to C30 alkyl group, OQ, or NHQ, wherein Q is the same as defined in the above.

In the above Chemical Formula 7, $n^{26}$ to $n^{29}$ are integers ranging from 0 to 4, and each $n^{26}+n^{27}$ and $n^{28}+n^{29}$ is an integer of less than or equal to 5.

At least one of $R^{70}$ and $R^{71}$ is OQ, and one aromatic ring includes one to three OQs and the other aromatic ring includes one to four OQs.

[Chemical Formula 8]

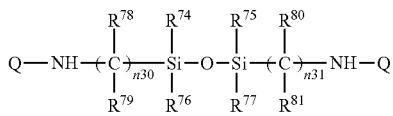

In the above Chemical Formula 8, $R^{74}$ to $R^{81}$ are independently hydrogen, or a substituted or unsubstituted C1 to C30 alkyl group, each $n^{30}$ and $n^{31}$ is an integer of 1 to 5, and Q is the same as defined above.

The photosensitive diazoquinone compound may include 5 to 100 parts by weight, and specifically 10 to 50 parts by weight based on 100 parts by weight of the alkali soluble resin. Within the ranges, the pattern is well-formed without a residue from exposure, and a film thickness loss during development may be prevented and thereby a good pattern is provided.

(C) Color Material

The photosensitive resin composition for an insulating film of a display device according to one embodiment includes a color material (C), and the color material has a v of 400 to 550 nm. The color material having a maximum absorption wavelength within the range may be a blue-based compound.

The color material may absorb light in a particular wavelength and effectively prevent light leakage in the particular wavelength. In addition, the color material has a high color realization rate with a small amount, insulation properties, and high solubility in an organic solvent, is present as a particle phase rather than a dispersion phase and thus, has excellent coating properties, and includes no dispersing agent and thus, has excellent developability in an alkali aqueous solution, and excellent durability.

The color material may include any color material having a maximum absorption wavelength ranging from 400 to 550 nm without a particular limit. Examples of the color material may include a dye, for example, a direct dye, an acidic dye, a basic dye, acidic mordant dye, an oxidation dye, a reduction dye, a dispersion dye, or a reactive dye. The dye may include a sulfide dye, azo-based dye, triarylmethane-based dye, azaporphyrin-based dye, anthraquinone-based dye, indigoid dye, carbonium ion-based dye, phthalocyanine-based dye, nitro dye, quinoline dye, cyanine dye, or polyxanthene-based dye, and they may be used singularly or in a mixture of two or more.

One example of the color material may be a triarylmethane-based dye. The triarylmethane-based dye may be, specifically a compound represented by the following Chemical Formula 10.

[Chemical Formula 10]

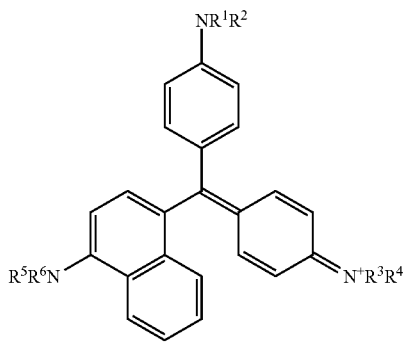

In the above Chemical Formula 10, $R^1$ to $R^6$ are independently selected from hydrogen, a halogen, a substituted or unsubstituted C1 to C20 alkyl group, a substituted or unsubstituted C3 to C20 cycloalkyl group, a substituted or unsubstituted C6 to C30 aryl group, and a substituted or unsubstituted C6 to C30 heteroaryl group.

Another example of the color material may be an azaporphyrin-based dye. The azaporphyrin-based dye may be specifically a compound represented by the following Chemical Formula 11.

[Chemical Formula 11]

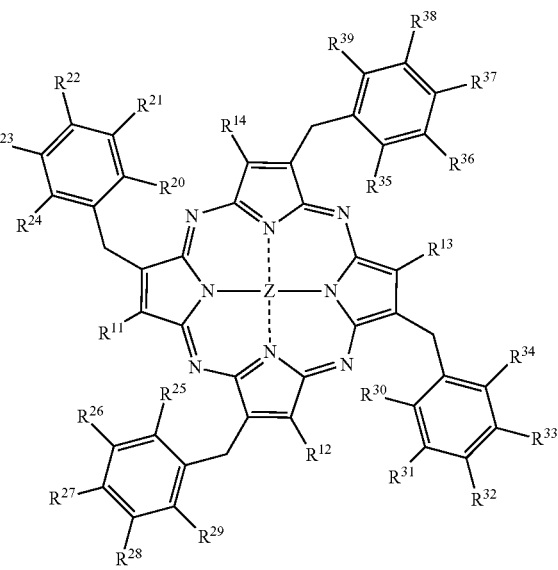

In the above Chemical Formula 11, $R^{11}$ to $R^{14}$ and $R^{20}$ to $R^{39}$ are each independently selected from a hydrogen atom, a halogen atom, a hydroxy group, a sulfonic acid group (—$SO_3H$), a nitro group, a carboxyl group, a cyan group, a substituted or unsubstituted C1 to C20 alkyl group, a substituted or unsubstituted C3 to C20 cycloalkyl group, a substituted or unsubstituted C1 to C20 heteroalkyl group, a substituted or unsubstituted C3 to C20 heterocycloalkyl group, a substituted or unsubstituted C6 to C30 aryl group, a substituted or unsubstituted C6 to C30 heteroaryl group, and a combination thereof.

At least one hydrogen atom of $R^{11}$ to $R^{14}$ and $R^{20}$ to $R^{39}$ may be substituted or unsubstituted with —$SO_3^-$ or —$SO_3M$, wherein the M is a sodium atom or a potassium atom, and Z is selected from two hydrogen atoms, a divalent metal atom, a divalent metal oxide, a divalent metal hydroxide, and a divalent metal chloride. Examples of the Z may be VO, TiO, Zn, Mg, Si, Sn, Rh, Pt, Pd, Mo, Mn, Pb, Cu, Ni, Co, Fe, AlCl, InCl, FeCl, $TiCl_2$, $SnCl_2$, $SiCl_2$, $GeCl_2$, $Si(OH)_2$, $H_2$, and the like, for example Z may be Cu.

The color material may be used singularly or in a mixture of two or more. When the color material is used in a mixture of two or more, the two or more kinds of compound may be used in various component ratios.

The color material may have solubility of 1 to 10 for a solvent. In this case, the color material may ensure compatibility to inhibit precipitation.

The solvent may include, for example N-methyl-2-pyrrolidone, γ-butyrolactone, N,N-dimethylacetamide, dimethylsulfoxide, diethyleneglycoldimethylether, diethylene glycoldiethylether, diethyleneglycoldibutylether, propyleneglycolmonomethylether, dipropyleneglycolmonomethylether, propyleneglycolmonomethyletheracetate, methyl lactate, ethyl lactate, butyl lactate, methyl-1,3-butyleneglycolacetate, 1,3-butyleneglycol-3-monomethylether, methyl pyruvate, ethyl pyruvate, methyl-3-methoxy propionate, cyclohexanone, or a combination thereof.

The color material may be used in an amount of 1 to 30 parts by weight, specifically 5 to 20 parts by weight, or 5 to 15 parts by weight based on 100 parts by weight of the alkali soluble resin. Within the above range, the color material may inhibit light leakage effectively.

(D) Solvent

The photosensitive resin composition for an insulating film of a display device may include a solvent that is capable of easily dissolving each component.

Examples of the solvent may include N-methyl-2-pyrrolidone, γ-butyrolactone, N,N-dimethylacetamide, dimethylsulfoxide, diethyleneglycoldimethylether, diethylene glycoldiethylether, diethyleneglycoldibutylether, propyleneglycolmonomethylether, dipropyleneglycolmonomethylether, propyleneglycolmonomethyletheracetate, methyl lactate, ethyl lactate, butyl lactate, methyl-1,3-butyleneglycolacetate, 1,3-butyleneglycol-3-monomethylether, methyl pyruvate, ethyl pyruvate, methyl-3-methoxy propionate, and the like. The solvent may be used singularly or as a mixture of two or more.

The solvent may be used in an amount of 100 to 900 parts by weight, and specifically 200 to 700 parts by weight based on 100 parts by weight of the alkali soluble resin. Within the range, a sufficiently thick film may be obtained, and good solubility and coating properties may be provided.

Specifically, the solvent may be used so that a solid content of the photosensitive resin composition for an insulating film of a display device is 3 to 50 wt %, and specifically 5 to 30 wt %.

(E) Silane Compound

The photosensitive resin composition for an insulating film of a display device may further include a silane compound. The silane compound improves adherence between the photosensitive resin composition for an insulating film of a display device and a substrate.

The silane compound may include a silane compound having a carbon-carbon unsaturated bond such as compounds represented by the following Chemical Formulae 12 to 14; vinyltrimethoxysilane, vinyltriethoxysilane, vinyltrichlorosilane, vinyltris(β-methoxyethoxy)silane; or 2-(3,4 epoxycyclohexyl)-ethyltrimethoxysilane, 3-methacryloxypropyltrimethoxysilane, 3-acryloxypropyltrimethoxysilane, p-styryltrimethoxysilane, 3-methacryloxypropylmethyldimethoxysilane, 3-methacryloxypropylmethyldiethoxysilane; trimethoxy[3-(phenylamino)propyl]silane, and the like, but is not limited thereto.

[Chemical Formula 12]

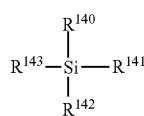

In the above Chemical Formula 12, $R^{140}$ is a vinyl group, a substituted or unsubstituted alkyl group, or a substituted or unsubstituted aryl group, and specifically 3-(meth)cryloxypropyl, p-styryl, or 3-(phenylamino)propyl.

In the above Chemical Formula 12, $R^{141}$ to $R^{143}$ are each independently a substituted or unsubstituted alkoxy group, a substituted or unsubstituted alkyl group, or a halogen, wherein at least one of $R^{141}$ to $R^{143}$ is an alkoxy group or a halogen, and the alkoxy group may be specifically a C1 to C8 alkoxy group, and the alkyl group may be a C1 to C20 alkyl group.

[Chemical Formula 13]

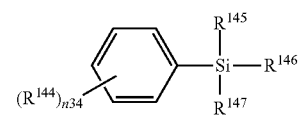

In the above Chemical Formula 13, $R^{144}$ is —$NH_2$ or —$CH_3CONH$, $R^{145}$ to $R^{147}$ are independently a substituted or unsubstituted C1 to C20 alkoxy group, specifically the alkoxy group may be $OCH_3$ or $OCH_2CH_3$, and $n_{34}$ is an integer of 1 to 5.

[Chemical Formula 14]

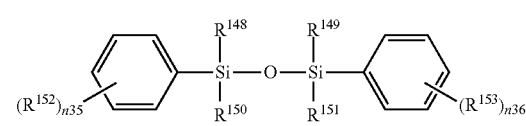

In the above Chemical Formula 14, $R^{148}$ to $R^{151}$ are independently a substituted or unsubstituted C1 to C20 alkyl group, or a substituted or unsubstituted C1 to C20 alkoxy group, and specifically $CH_3$ or $OCH_3$.

In the above Chemical Formula 14, $R^{152}$ and $R^{153}$ are independently a substituted or unsubstituted amino group, and specifically $NH_2$ or $CH_3CONH$. $n_{35}$ and $n_{36}$ are independently an integer ranging from 1 to 5.

The silane compound may be included in an amount of 0.1 to 30 parts by weight, and specifically 0.5 to 10 parts by weight based on 100 parts by weight of the alkali soluble resin. Within the range, adherence between lower and upper layers is sufficiently improved, residual film may not remain after development, optical properties such as transmittance and mechanical properties such as tensile strength, elongation, and the like may be improved.

(F) Phenol Compound

The photosensitive resin composition for an insulating film of a display device may further include a phenol compound. The phenol compound plays a role of increasing a dissolution rate and sensitivity of an exposed part and forming a pattern with a high resolution without any residue during the development using an alkali aqueous solution when the photosensitive resin composition is used to form the pattern.

The phenol compound may include compounds represented by the following Chemical Formulae 15 to 21, but is not limited thereto.

[Chemical Formula 15]

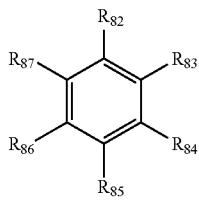

In the above Chemical Formula 15, $R_{82}$ to $R_{87}$ are independently hydrogen, a hydroxy group (OH), a C1 to C8 substituted or unsubstituted alkyl group, a C1 to C8 alkoxyalkyl or —OCO—$R_{88}$, wherein $R_{88}$ is a C1 to C8 substituted or unsubstituted alkyl group, at least one of $R_{82}$ to $R_{87}$ is a hydroxyl group, and all $R_{82}$ to $R_{87}$ are not a hydroxyl group.

[Chemical Formula 16]

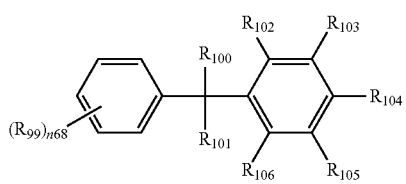

In the above Chemical Formula 16, $R_{99}$ to $R_{101}$ are independently hydrogen, or a C1 to C8 substituted or unsubstituted alkyl group, $R_{102}$ to $R_{106}$ are independently H, OH, or a C1 to C8 substituted or unsubstituted alkyl group, specifically the alkyl group may be $CH_3$, and $n_{68}$ is an integer ranging from 1 to 5.

[Chemical Formula 17]

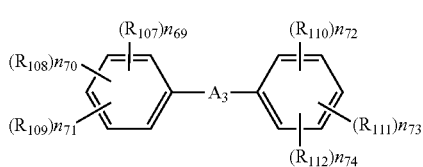

In the above Chemical Formula 17, $R_{107}$ to $R_{112}$ are each independently H, OH, or a C1 to C8 substituted or unsubstituted alkyl group, $A_3$ is $CR_{205}R_{206}$ or a single bond, wherein $R_{205}$ and $R_{206}$ are independently hydrogen, or a C1 to C8 substituted or unsubstituted alkyl group, and specifically $CH_3$, and $n_{69}+n_{70}+n_{71}$ and $n_{72}+n_{73}+n_{74}$ are independently integers of less than or equal to 5.

[Chemical Formula 18]

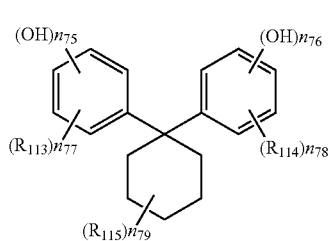

In the above Chemical Formula 18, $R_{113}$ to $R_{115}$ are independently hydrogen, or a C1 to C8 substituted or unsubstituted alkyl group, $n_{75}$, $n_{76}$ and $n_{79}$ are independently integers ranging from 1 to 5, and $n_{77}$ and $n_{78}$ are independently integers ranging from 0 to 4.

[Chemical Formula 19]

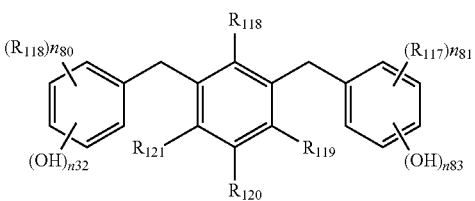

In the above Chemical Formula 19, $R_{116}$ to $R_{121}$ are independently hydrogen, OH, or a C1 to C8 substituted or unsubstituted alkyl group, and $n_{80}$ to $n_{83}$ are independently integers ranging from 1 to 4. $n_{80}+n_{82}$ and $n_{81}+n_{83}$ are independently integers of less than or equal to 5.

[Chemical Formula 20]

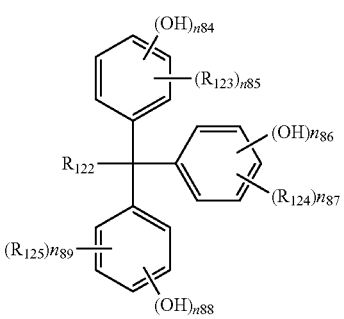

In the above Chemical Formula 20, $R_{122}$ is a C1 to C8 substituted or unsubstituted alkyl group, and specifically $CH_3$, $R_{123}$ to $R_{125}$ are independently hydrogen, or a C1 to C8 substituted or unsubstituted alkyl group, $n_{84}$, $n_{86}$ and $n_{88}$ are independently integers of 1 to 5, and $n_{85}$, $n_{87}$ and $n_{89}$ are independently integers ranging from 0 to 4. $n_{84}+n_{85}$, $n_{86}+n_{87}$ and $n_{88}+n_{89}$ are independently integers of less than or equal to 5.

[Chemical Formula 21]

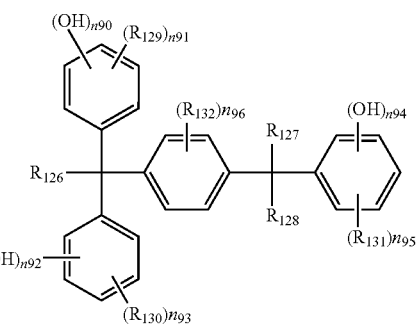

In the above Chemical Formula 21, $R_{126}$ to $R_{128}$ are independently a C1 to C8 substituted or unsubstituted alkyl group, and specifically $CH_3$, $R_{129}$ to $R_{132}$ are independently hydrogen, or a C1 to C8 substituted or unsubstituted alkyl group, $n_{90}$, $n_{92}$ and $n_{94}$ are independently integers ranging from 1 to 5, $n_{91}$, $n_{93}$ and $n_{95}$ are independently integers ranging from 0 to 4, and $n_{96}$ is an integer ranging from 1 to 4. $n_{90}+n_{91}$, $n_{92}+n_{93}$ and $n_{94}+n_{95}$ are independently integers of less than or equal to 5.

Examples of the phenol compound may include 2,6-dimethoxymethyl-4-t-butylphenol, 2,6-dimethoxymethyl-p-cresol, 2,6-diacetoxymethyl-p-cresol, and the like, but is not limited thereto.

The phenol compound may be included in an amount of 1 to 30 parts by weight based on 100 parts by weight of the alkali soluble resin. When the phenol compound is included within the range, the photosensitive resin composition may not deteriorate sensitivity but appropriately increase dissolution rate of a non-exposed part during the development, resultantly obtaining a good pattern. In addition, when the phenol compound is not precipitated during the storage in a freezer, excellent storage stability may be accomplished.

(G) Other Additive

The photosensitive resin composition for an insulating film of a display device according to one embodiment may further include other additives.

The photosensitive resin composition for an insulating film of a display device may include an additive such as malonic acid; 3-amino-1,2-propanediol; a silane coupling agent having a vinyl group or a (meth)acryloxy group in order to prevent a stain of the film during coating, leveling improvement, or residues generation due to non-development. A use amount of the additive may be controlled depending on desired properties.

The photosensitive resin composition for an insulating film of a display device may further include an additive of an epoxy compound in order to improve adherence with a substrate. The epoxy compound may include an epoxy novolac acryl carboxylate resin, an ortho cresol novolac epoxy resin, a phenol novolac epoxy resin, a tetramethyl biphenyl epoxy resin, a bisphenol A epoxy resin, an alicyclic epoxy resin, or a combination thereof.

When the epoxy compound is further used, a radical polymerization initiator such as a peroxide initiator or an azobis-based initiator may be further used.

The epoxy compound may be included in an amount of 0.01 to 5 parts by weight based on 100 parts by weight of the photosensitive resin composition for an insulating film of a display device. When the epoxy compound is used within the range, storage and adherence and other characteristics may be improved economically.

A method of preparing the photosensitive resin composition for an insulating film of a display device is not particularly limited, but may be prepared by mixing the color material, acryl-based binder resin, a photopolymerization initiator, a photopolymerizable monomer, solvent, and optionally the additive to prepare a photosensitive resin composition for an insulating film of a display device.

In addition, the photosensitive resin composition for an insulating film of a display device may further include a latent thermal acid generator. The latent thermal acid generator may include an aryl sulfonic acid such as p-toluene sulfonic acid, benzene sulfonic acid, and the like; perfluoroalkyl sulfonic acid such as trifluoromethane sulfonic acid, trifluorobutane sulfonic acid, and the like; alkyl sulfonic acid such as methane sulfonic acid, ethane sulfonic acid, butane sulfonic acid, and the like; or a combination thereof, but is not limited thereto.

The latent thermal acid generator is a catalyst for a dehydration reaction and a cyclization reaction of the polybenzoxazole precursor that is polyamide including a phenolic hydroxy group, and thus a cyclization reaction may be performed smoothly even if a curing temperature is decreased.

In addition, an additive such as a suitable surfactant or leveling agent may be included in order to prevent a stain of the film or to improve the development.

According to another embodiment, an insulating film of a display device manufactured using the photosensitive resin composition for an insulating film of a display device is provided.

The insulating film of a display device may be formed according to the following method. The photosensitive resin composition is coated on the surface of a substrate in a spraying method, a roll coater method, a spinning coating method, and the like, and a solvent therein is pre-baked and removed to form a coating film. The pre-baking is performed at a temperature ranging from 70 to 120° C. for 1 to 5 minutes. Then, the pre-baked coating film is radiated by a visible ray, ultraviolet (UV), far ultraviolet (UV), an electron beam, far ultraviolet (UV), an x-ray, and the like according to a predetermined pattern and then, developed to remove an unnecessary part, obtaining the predetermined pattern. Herein, the development solution may include an alkali aqueous solution and specifically, be selected from inorganic alkalis such as sodium hydroxide, potassium hydroxide, sodium carbonate, and the like; primary amines such as ethylamine, n-propylamine, and the like; diethylamine, secondary amines such as n-propylamine and the like; tertiary amines such as trimethylamine, methyldiethylamine, dimethylethylamine, triethylamine, and the like; alcohol amines such as dimethylethanolamine, methyl diethanolamine, triethanolamine, and the like; a quaternary ammonium salt aqueous solution such as tetramethylammonium hydroxide, tetraethylammonium hydroxide, and the like; and a mixture thereof. The development solution includes an alkali compound in a concentration of 0.1 to 10%. In addition, a water-soluble organic solvent such as methanol ethanol and the like or a surfactant along with the solvent may be used in an appropriate amount. Accordingly, the insulating film is developed with the development solution and then, washed with ultra-pure water for 30 to 140 seconds to remove an unnecessary part and dried to obtain a pattern. The pattern is radiated by a light such as ultraviolet (UV) and the like and heated at a temperature ranging from 110 to 250° C. for 30 to 120 minutes in an oven and the like, obtaining a final pattern.

In another embodiment of the present invention, a display device including the insulating film is provided. The display device may be a liquid crystal display, a light emitting diode, a plasma display, or an organic light emitting diode (OLED).

[Mode for Invention]

The following examples illustrate the present invention in more detail. However, it is understood that the present invention is not limited by these examples.

SYNTHESIS EXAMPLE 1

Preparation of Polybenzooxazole Precursor 41.1 g of 2,6-bis[[[5-[1-(amino-4-hydroxyphenyl)-2,2,2-trifluoro-1-(trifluoromethyl)ethyl]-2-hydroxyphenyl]amino]methyl]-4-methylphenol was dissolved in 280 g of N-methyl-2-pyrrolidone (NMP) in a 4-necked flask equipped with an agitator, a thermometer, a nitrogen gas injector, and a cooler, while a nitrogen gas was passed therethrough. When the solid was completely dissolved, 9.9 g of pyridine was added to the solution, and a solution prepared by dissolving 13.3 g of 4,4'-oxydibenzoylchloride in 142 g of N-methyl-2-pyrrolidone (NMP) was slowly added thereto in a dropwise fashion for 30 minutes, while the temperature was maintained at 0 to 5° C. The mixture was reacted for 1 hour at the temperature ranging from 0 to 5° C., the temperature was increased up to room temperature, and the reactant was agitated for one hour, terminating the reaction.

1.6 g of 5-norbornene-2,3-dicarboxyl anhydride was added thereto and was agitated at 70° C. for 24 hours, terminating the reaction. The reaction mixture was added to a solution prepared by mixing water/methanol in a volume ratio of 10/1 to produce a precipitate. The precipitate was filtered, sufficiently washed with water, and vacuum-dried at 80° C. for greater than or equal to 24 hours to prepare a polybenzoxazole precursor having a weight average molecular weight of 9,500.

Hereinafter, the following components used in Examples are as follows.

(A) Alkali Soluble Resin

The polybenzoxazole precursor prepared according to Synthesis Example 1 was used.

(B) Photosensitive Diazoquinone Compound

The photosensitive diazoquinone represented by the following Chemical Formula 22 was used.

[Chemical Formula 22]

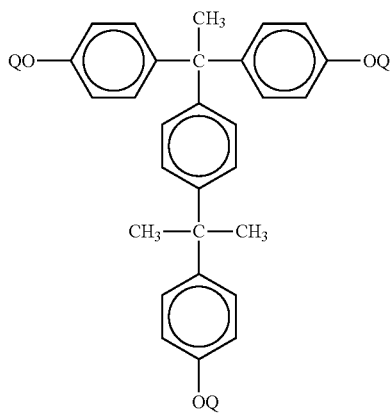

In the above Chemical Formula 22 two of three Q's are substituted with the following Chemical Formula 23, and the last one Q is substituted with hydrogen.

[Chemical Formula 23]

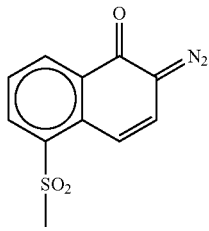

(C) Color Material (C-1) Victoria blue represented by the following Chemical Formula 24 was used.

[Chemical Formula 24]

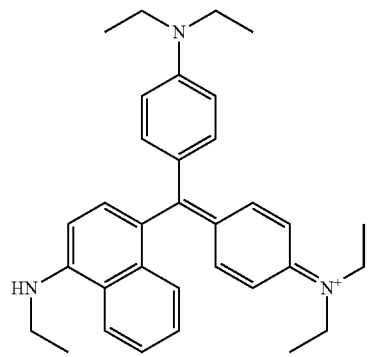

(C-2) An azoporphyrin-based dye (B90401, Kyung-In Synthetic Co.) was used.

(D) Solvent (D-1) γ-butyrolactone was used.

(D-2) Propyleneglycol monomethylether (PGME) was used.

(E) Silane Compound

Trimethoxy[3-(phenylamino)propyl]silane represented by the following Chemical Formula 25 was used.

[Chemical Formula 25]

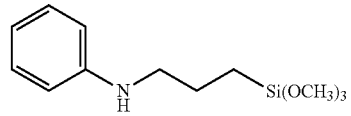

(F) Phenol Compound

A phenol compound represented by the following Chemical Formula 26

[Chemical Formula 26]

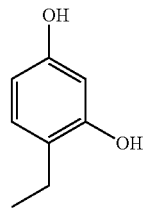

(G) Other Solvent

Cyclohexanone

EXAMPLES 1 TO 6 AND COMPARATIVE EXAMPLE 1

Each photosensitive resin composition for an insulating film of a display device was prepared by mixing components according to the compositions the following Table 1. Specifically, the alkali soluble resin (A) was dissolved in the solvent (D), and the photosensitive diazoquinone compound (B), a silane compound (E), and a phenol compound (F) were added thereto. Then, 10 wt % of the color material (C) dissolved in the other solvent (G) was added to the mixture, and the resultant was agitated for 3 hours at room temperature and was filtered with a 0.45 μm fluoro resin filter to prepare each photosensitive resin composition for an insulating film of a display device.

pattern to have a line width of 1:1 after the exposure and development. A minimum pattern dimension in the optimal exposure time was obtained as resolution of the pattern films.

TABLE 1

|  |  | Example 1 | Example 2 | Example 3 | Example 4 | Example 5 | Example 6 | Comparative Example 1 |
|---|---|---|---|---|---|---|---|---|
| (A) Alkali soluble resin | | 100 | 100 | 100 | 100 | 100 | 100 | 100 |
| (B) Photosensitive diazoquinone compound | | 10 | 10 | 10 | 10 | 10 | 10 | 10 |
| (C) Color material | C-1 | 5 | 10 | 20 | — | — | — | — |
|  | C-2 | — | — | — | 5 | 10 | 20 | — |
| (D) Solvent | D-1 | 100 | 100 | 100 | 100 | 100 | 100 | 100 |
|  | D-2 | 250 | 250 | 250 | 250 | 250 | 250 | 250 |
| (E) Silane compound | | 0.2 | 0.2 | 0.2 | 0.2 | 0.2 | 0.2 | 0.2 |
| (F) Phenol compound | | 7.5 | 7.5 | 7.5 | 7.5 | 7.5 | 7.5 | 7.5 |
| (G) Other solvent | | 45 | 90 | 180 | 45 | 90 | 180 | — |

In Table 1, the components (B) to (G) were used as a unit of a used part by weight based on 100 parts by weight of the component (A).

Manufacture of Pattern Film

The photosensitive resin compositions for an insulating film of a display device according to Examples 1 to 6 and Comparative Example 1 were respectively coated on an ITO glass with a spin coater and heated up to 130° C. for 2 minutes on a hot plate, forming coating films. The films were exposed to a light using a predetermined pattern mask and an exposure equipment (I-line stepper, NSR i10C, Nikon Inc.) The exposed part was dissolved and removed in a 2.38% tetramethyl ammonium hydroxide aqueous solution at temperature for 40 seconds through 2 puddles, and the remaining part was washed with distilled water for 30 seconds. Then, the obtained patterns were cured at 250° C. for 60 minutes under an oxygen concentration of less than or equal to 1000 ppm, to obtain pattern films.

EVALUATION EXAMPLES

Film residue ratios, sensitivity, residue, luminance, and dielectric constant of the manufactured pattern films were evaluated according to the following method. The results are provided in the following Table 2.

(1) Measurement of Film Residue Ratio

The pre-baked films were developed in a 2.38% tetramethyl ammonium hydroxide (TMAH) aqueous solution at 23° C. for 60 seconds, washed with ultra-pure water for 60 seconds, and dried and then, measured regarding thickness change using an Alpha step (Tencor Co.) and calculated according to the following Calculation Equation 1.

Film residue ratio=(thickness after development/initial thickness before development)×100 [Calculation Equation 1]

(○: excellent film residue ratio of greater than or equal to 90%, Δ: medium film residue ratio of 80-90%, X: low film residue ratio of less than or equal to 80%)

(2) Measurement of Sensitivity

Optimal exposure times of the pattern films were obtained by measuring exposure times taking to form a 10 μm L/S pattern to have a line width of 1:1 after the exposure and development. A minimum pattern dimension in the optimal exposure time was obtained as resolution of the pattern films.

(○: excellent sensitivity of less than or equal to 50 mJ/cm², Δ: medium sensitivity of 50-200 mJ/cm², X: low sensitivity of greater than or equal to 200 mJ/cm²)

(3) Measurement of Residues

Residues of the patterns formed by using the photosensitive resin compositions were confirmed using an optical microscope and CD-SEM.

(Occurrence: high residues, medium occurrence: medium residues, no occurrence: no residue)

(4) Measurement of (White) Luminance

White luminance of a module manufactured by using the resin composition was measured by using a Minolta luminance meter (CA-210, a display color analyzer) 10 minutes later after connected to a power for stabilization. When R/G/B are all 0 in an 8 bit digital system, black is realized, while when all are 255, white is realized. However, when one of three primary colors is given a signal (255, 0, 0), pure red is realized, when a second is given a signal (0, 255, 0), green is realized, and when a third one is given a signal (0, 0, 255), blue is realized. Accordingly, when each luminance of R, G, and B is measured and added up together, the sum should be the same as luminance of white. However, (R+G+B)/3 may not be equal to 255 depending on characteristic of each display, because each channel does not have a completely independent characteristic, and a particular color has a light leakage.

(○: excellent luminance of greater than or equal to 250, Δ: medium luminance ranging from 250-245, X: low luminance of less than or equal to 245)

(5) Measurement of Dielectric Constant

Each resin composition was coated on an ITO glass and treated at 130° C. for 2 minutes on a hot plate, to form each 2.0-2.5 μm-thick coating film. A metal electrode (Au) having a diameter of 300 μm was deposited on each coating film. A dielectric constant was calculated by measuring capacitance with a precision impedance analyzer (HP 4294A) and using the following Calculation Equation 2.

$$C = \epsilon_0 \times \epsilon \times A/d \quad \text{[Calculation Equation 2]}$$

In Calculation Equation 2, C denotes capacitance, $\in_0$ denotes a dielectric constant under vacuum, $\in$ denotes a non-dielectric ratio, A denotes an electrode area, and d denotes thickness of a photosensitive resin composition.

(○: dielectric constant of less than or equal to 5.5, X: dielectric constant of greater than 5.5)

TABLE 2

| | Film residue ratio | Sensitivity | Residue | Luminance | Dielectric constant |
|---|---|---|---|---|---|
| Example 1 | ○ | ○ | Medium | Δ | ○ |
| Example 2 | ○ | ○ | None | Δ | ○ |
| Example 3 | ○ | ○ | None | ○ | ○ |
| Example 4 | ○ | ○ | Medium | Δ | ○ |
| Example 5 | ○ | ○ | None | Δ | ○ |
| Example 6 | ○ | ○ | None | ○ | ○ |
| Comparative Example 1 | ○ | ○ | Medium | X | ○ |

As shown in Table 2, the resin compositions according to Examples 1 to 6 maintained excellent film residue ratios and sensitivity in a non-exposed part, an excellent residue and dielectric constant, and improved luminance, while the resin composition according to Comparative Example 1 had a residue in an exposed part and a light leakage and thus, low luminance. In other words, the resin compositions according to Examples 1 to 6 effectively prevented light leakage and improved color purity and color characteristic.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A photosensitive resin composition for an insulating film of a display device, comprising:
   (A) an alkali soluble resin, wherein the alkali soluble resin (A) is a polybenzoxazole precursor, polyamic acid, polyimide, or a combination thereof;
   (B) a photosensitive diazoquinone compound;
   (C) a color material having a maximum absorption wavelength of 400 to 550 nm; and
   (D) a solvent,
   wherein the color material includes a compound represented by the following Chemical Formula 10, a compound represented by the following Chemical Formula 11, or a combination thereof:

[Chemical Formula 10]

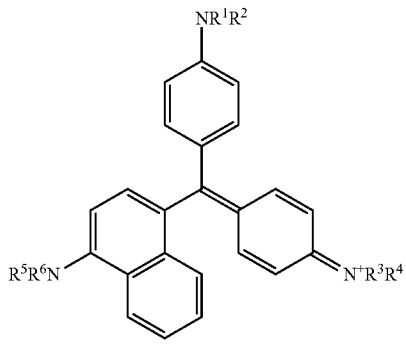

wherein in the above Chemical Formula 10, $R^1$ to $R^6$ are independently selected from hydrogen, a halogen, a substituted or unsubstituted C1 to C20 alkyl group, a substituted or unsubstituted C3 to C20 cycloalkyl group, a substituted or unsubstituted C6 to C30 aryl group, and a substituted or unsubstituted C6 to C30 heteroaryl group;

[Chemical Formula 11]

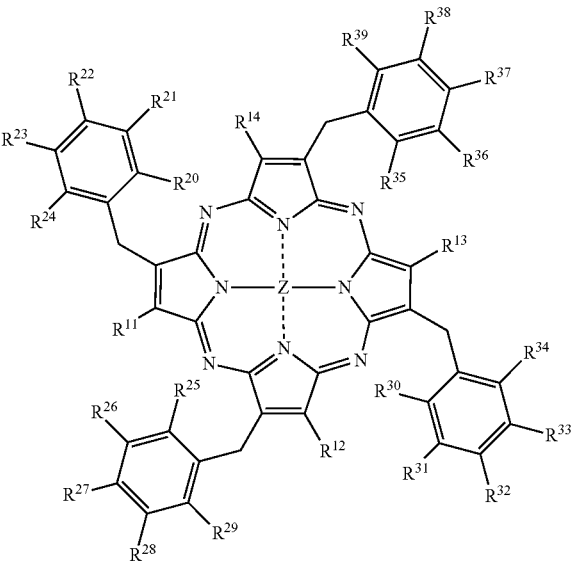

wherein in the above Chemical Formula 11,
$R^{11}$ to $R^{14}$ and $R^{20}$ to $R^{39}$ are each independently selected from a hydrogen atom, a halogen atom, a hydroxy group, a sulfonic acid group ($—SO_3H$), a nitro group, a carboxyl group, a cyan group, a substituted or unsubstituted C1 to C20 alkyl group, a substituted or unsubstituted C3 to C20 cycloalkyl group, a substituted or unsubstituted C1 to C20 heteroalkyl group, a substituted or unsubstituted C3 to C20 heterocycloalkyl group, a substituted or unsubstituted C6 to C30 aryl group, a substituted or unsubstituted C6 to C30 heteroaryl group, and a combination thereof, and
Z is selected from two hydrogen atoms, a divalent metal atom, a divalent metal oxide, a divalent metal hydroxide, and a divalent metal chloride.

2. The photosensitive resin composition of claim 1 comprising:
   5 to 100 parts by weight of the photosensitive diazoquinone compound (B);
   1 to 30 parts by weight of the color material (C); and
   100 to 900 parts by weight of the solvent (D)
   based on 100 parts by weight of the alkali soluble resin (A).

3. The photosensitive resin composition of claim 1, further comprising a silane compound.

4. The photosensitive resin composition of claim 1, further comprising a phenol compound.

5. An insulation film of a display device manufactured using the photosensitive resin compositions according to claim 1.

6. A display device including the insulation film according to claim 5.

* * * * *

UNITED STATES PATENT AND TRADEMARK OFFICE
CERTIFICATE OF CORRECTION

Page 1 of 1

PATENT NO.       : 9,465,289 B2
APPLICATION NO.  : 14/416204
DATED            : October 11, 2016
INVENTOR(S)      : Ji-Yun Kwon et al.

It is certified that error appears in the above-identified patent and that said Letters Patent is hereby corrected as shown below:

In the Specification

Column 14, delete Chemical Formula 19 and insert:

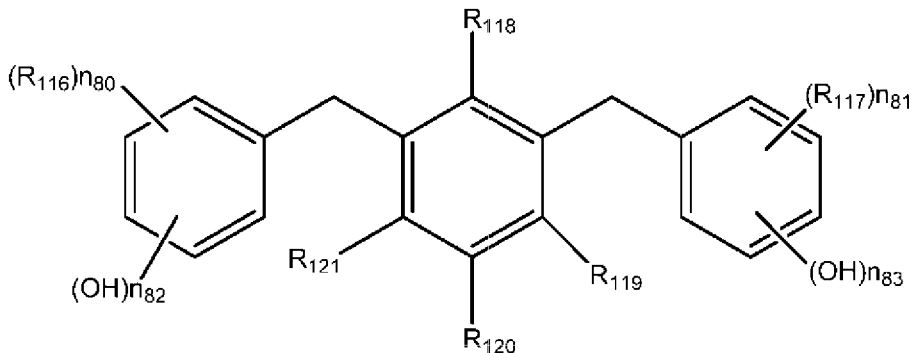

--                                                                                                                                --

Signed and Sealed this
Thirtieth Day of May, 2017

Michelle K. Lee
*Director of the United States Patent and Trademark Office*